US006762474B1

(12) United States Patent
Mills, Jr.

(10) Patent No.: US 6,762,474 B1
(45) Date of Patent: Jul. 13, 2004

(54) METHOD AND APPARATUS FOR TEMPERATURE COMPENSATION OF READ-ONLY MEMORY

(75) Inventor: Allen P. Mills, Jr., Chatham Township, Morris County, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/479,708

(22) Filed: Jan. 7, 2000

Related U.S. Application Data

(63) Continuation-in-part of application No. 09/095,231, filed on Jun. 10, 1998, now abandoned.

(51) Int. Cl.[7] .............................................. H01L 31/058
(52) U.S. Cl. ..................... 257/469; 257/536; 257/537; 257/538; 257/904
(58) Field of Search ........................ 257/469, 536–538, 257/904

(56) References Cited

U.S. PATENT DOCUMENTS

| 4,727,269 | A | * | 2/1988 | Luich ........................ 307/530 |
| 5,047,655 | A | | 9/1991 | Chambost et al. .......... 307/201 |
| 5,394,343 | A | * | 2/1995 | Tsao ........................... 364/558 |
| 5,544,000 | A | * | 8/1996 | Suzuki et al. ............... 361/139 |
| 5,548,252 | A | * | 8/1996 | Watanabe et al. ........... 331/176 |
| 5,585,741 | A | * | 12/1996 | Jordan ........................ 326/630 |
| 5,627,457 | A | * | 5/1997 | Ishiyama et al. ........... 323/318 |
| 5,729,154 | A | * | 3/1998 | Taguchi et al. ............... 326/30 |
| 5,847,442 | A | | 12/1998 | Mills, Jr. et al. ............ 257/538 |
| 5,859,458 | A | * | 1/1999 | Hsueh et al. ................ 257/347 |
| 5,881,014 | A | | 3/1999 | Ooishi ........................ 385/226 |
| 6,028,472 | A | * | 2/2000 | Nagumo ...................... 327/512 |

FOREIGN PATENT DOCUMENTS

FR 2071501 9/1971 ............ G11C/5/00

* cited by examiner

Primary Examiner—Allan R. Wilson
Assistant Examiner—Matthew E. Warren

(57) ABSTRACT

A method and apparatus for temperature compensation of a resistive based Read-Only Memory device is disclosed. In accordance with the method of the invention, the input voltage supplied to ROM device is adjusted in response to changes in temperature to maintain the current through the ROM at a substantially constant level even as the resistivity of the temperature-dependent connection resistors changes. In one embodiment of the invention, the voltage across the reference resistor is determined by providing a constant current source to the reference resistor and this voltage level is applied to the input of the ROM device. The reference resistor is selected to have similar properties of conductivity as those of the data resistor, for example, a polysilicon. As the temperature increases, the resistivity of a polysilicon data resistor and resistor decrease in a similar manner and, accordingly, the voltage across the reference resistor also decreases. The voltage across the reference resistor decreases at a rate commensurate with a decreased voltage drop across the data resistor, thus maintaining the current through a selected data resistor constant.

31 Claims, 3 Drawing Sheets

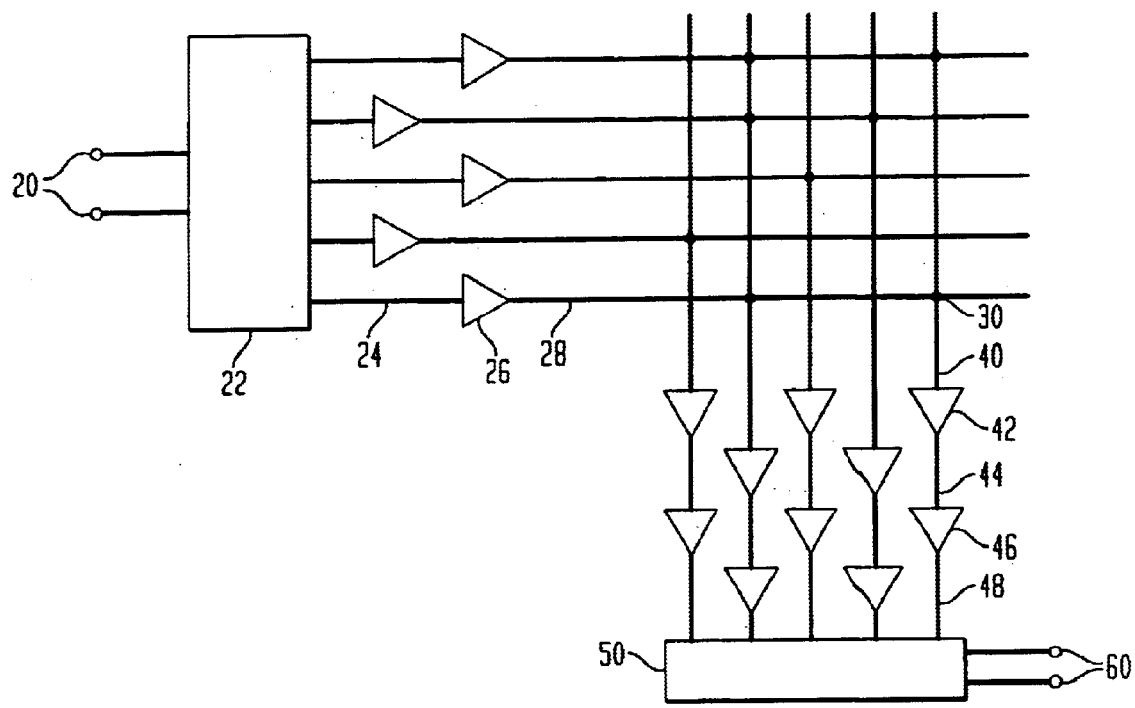
FIG. 1 *(Prior Art)*
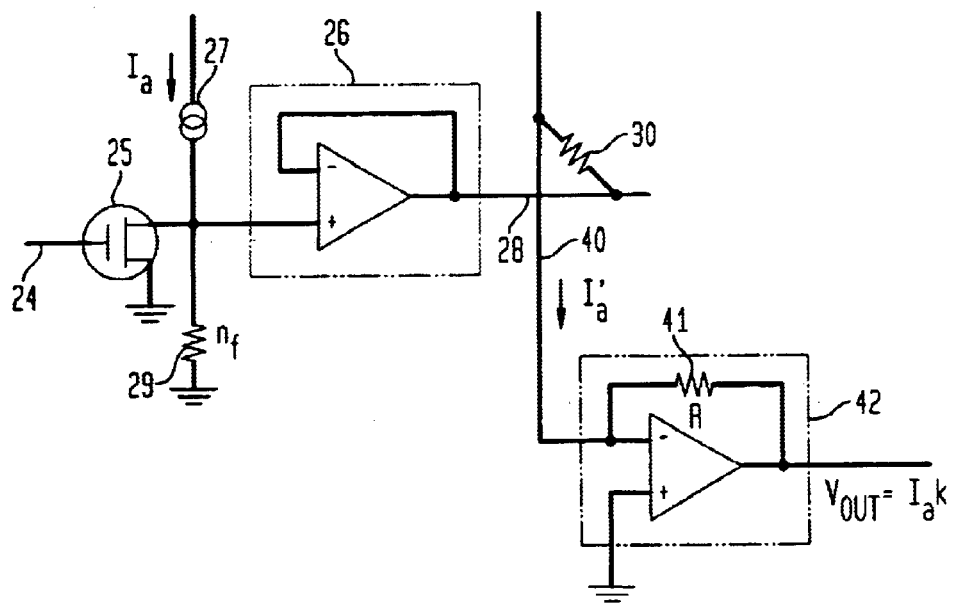
FIG. 2

METHOD AND APPARATUS FOR TEMPERATURE COMPENSATION OF READ-ONLY MEMORY

CROSS REFERENCE TO RELATED APPLICATIONS

This application is a continuation-in-part of U.S. patent application, Ser. No. 09/095,231 entitled "RESISTIVE ELEMENT FOR SEMICONDUCTOR DEVICES," filed on Jun. 10, 1998, now abandoned and related to U.S. patent application, Ser. No. 08/748,035 entitled "STRUCTURE FOR READ ONLY MEMORY," filed on Nov. 12, 1996, which subsequently issued as U.S. Pat. No. 5,847,442, which are assigned to the same assignee and are incorporated by reference herein.

FIELD OF THE INVENTION

This invention relates generally to electronic circuits and, more particularly, to temperature compensation of read-only-memory (ROM) electronic circuits.

BACKGROUND OF THE INVENTION

Read-Only Memories (ROMS) are well known in the art. Typically, ROMs are used in computer systems to provide a permanent storage of program instructions, such as mathematical functions, or informational data that is processed by mathematical functions. As is known in the art, a ROM typically consists of a planar array of parallel word lines, which are perpendicular to and insulated from a planar array of parallel bit lines. In one embodiment of a ROM device, the two planes containing the word lines and bit lines are vertically disposed from each other and separated by an insulating layer. Active semiconductor devices such as bi-polar transistors or metal oxide semiconductor field effect transistors (MOSFETs) interconnect the junction of each word line and each bit line to form a memory cell. Typically, in the fabrication process, and for economy of scale, all the cells are populated with devices, and then a link to a particular device is opened in the encoding process to render that cell inactive. The connection or lack of connection of a device at a memory cell determines whether a logic "1" or "0" is stored in the cell. The control electrode (base or gate) of the active device is connected to the word line, and the emitter or source electrode is typically connected to the bit line, for transistor or MOSFET devices, respectively. A positive potential on a word line turns "on" the device at that cell. Where there is no physical link at the cell there is no signal transmitted to the bit line. The bit lines are then read in parallel to obtain a group of "1" and "0" signals that form the output of the ROM.

ROM devices may also be fabricated with resistive interconnections. U.S. Pat. No. 5,847,442 to Mills, et al., entitled "Structure for Read-Only Memories," which is incorporated by reference herein teaches a ROM device fabricated using resistive devices to interconnect word and bit lines. The use of resistive devices is advantageous over transistor devices as resistive devices are easier to fabricate and smaller in size. A brief summary of the incorporated reference is presented to provide a better understanding of the invention claimed herein.

A ROM device fabricated with resistive devices is illustrated in FIG. 1 of the referred to U.S. Patent and is repeated herein as FIG. 1. In the device shown, only certain word lines 28 are connected to bit lines 40 by resistive device 30. The connection between word line 28 and bit line 40 is specified by the specific data stored in the ROM device. Resistive device 30 is formed as a column, or post, within the insulating material that separates parallel word line 28 from the vertically disposed parallel bit line 40.

Resistive device 30 may be fabricated within a wide range of values. In order to reduce cross-talk between word line 28 and bit line 40 the minimum value of resistance is in the order of tens of Megaohms. To achieve resistive values in the order of tens of Megaohms in the space allocated, resistive device 30 is typically comprised of a polysilicon material having a controlled resistivity. Polysilicon materials are well known in the art and, as is known, may be formulated in a doped or undoped condition. Doping elements are typically selected from a group of elements consisting of boron, phosphorous, arsenic, and antimony. As discussed in the referenced patent, a significant advantage of using a polysilicon post as a resistor device to interconnect word and bits lines is a decrease in the size of a memory cell as resistive devices are smaller and required less power than transistors or MOSFETs.

However, polysilicon is highly temperature sensitive, and, as is known in the art, the resistance of polysilicon decreases significantly with an increase in temperature. As the temperature increases and the resistivity of the connecting polysilicon resistive device decreases, the current through the resistive device increases. The increased current is known in the art to adversely affect the output voltage of the ROM as the output voltage is directly related to the current. One method of compensating for the increased output voltage is also disclosed in the aforementioned U.S. Patent. This method discloses using an operational amplifier with a gain characteristic responsive to the change in temperature as sense amplifier 42. As disclosed, the operational amplifier employs a feedback resistor with electrical and thermal characteristics similar to those of data resistor 30. In this method, the gain of the operational amplifier decreases as the resistance of the feedback resistor decreases. The decreased gain compensates for the increased data current and maintains the output voltage substantially constant.

However, a disadvantage of this method of compensation is that the current flowing through the ROM device remains strongly related to the change in temperature. This change in current flow further affects the switching speed of the ROM device, and accordingly, the switching speed remains strongly influenced by the change in temperature.

SUMMARY OF THE INVENTION

The present invention relates to temperature compensation of Read-Only Memory (ROM) that uses a temperature sensitive resistive material to connect word and bit lines. In such devices, the change in temperature adversely affects the output voltage and the switching speed of the ROM.

In accordance with the invention, the current through a data resistive device is maintained at a substantially constant level by supplying to the ROM an input reference voltage that is responsive to changes in temperature. In one embodiment of the invention, an input reference voltage is developed by supplying a constant current source across a temperature-dependent reference resistor. The resistance of a reference resistor changes in response to changes in temperature and the voltage across the reference resistor (and input to the ROM) changes accordingly. By changing the input voltage in response to a change in temperature, the data current to the ROM data resistors remains substantially constant. With a substantially constant current flow through the ROM device, the output voltage and ROM switching speed are maintained substantially constant.

In an exemplary embodiment of the invention, the reference resistor is made from a material that has a similar temperature-dependent resistivity as the material selected as the resistive device that interconnects word and bit lines within the ROM. In this embodiment of the invention, a change in resistance of the reference resistor matches a change in resistance of the data resistor, thus causing the current flow through the data resistor to remain substantially constant for any change in temperature.

BRIEF DESCRIPTION OF THE DRAWINGS

The advantages, nature and various additional features of the invention will appear more fully upon consideration of the illustrative embodiments to be described in detail in connection with the accompanying drawings. In the drawings:

FIG. 1 is a plan view of a ROM device constructed using resistive devices;

FIG. 2 is a circuit diagram of one embodiment of the invention;

Figure 3:
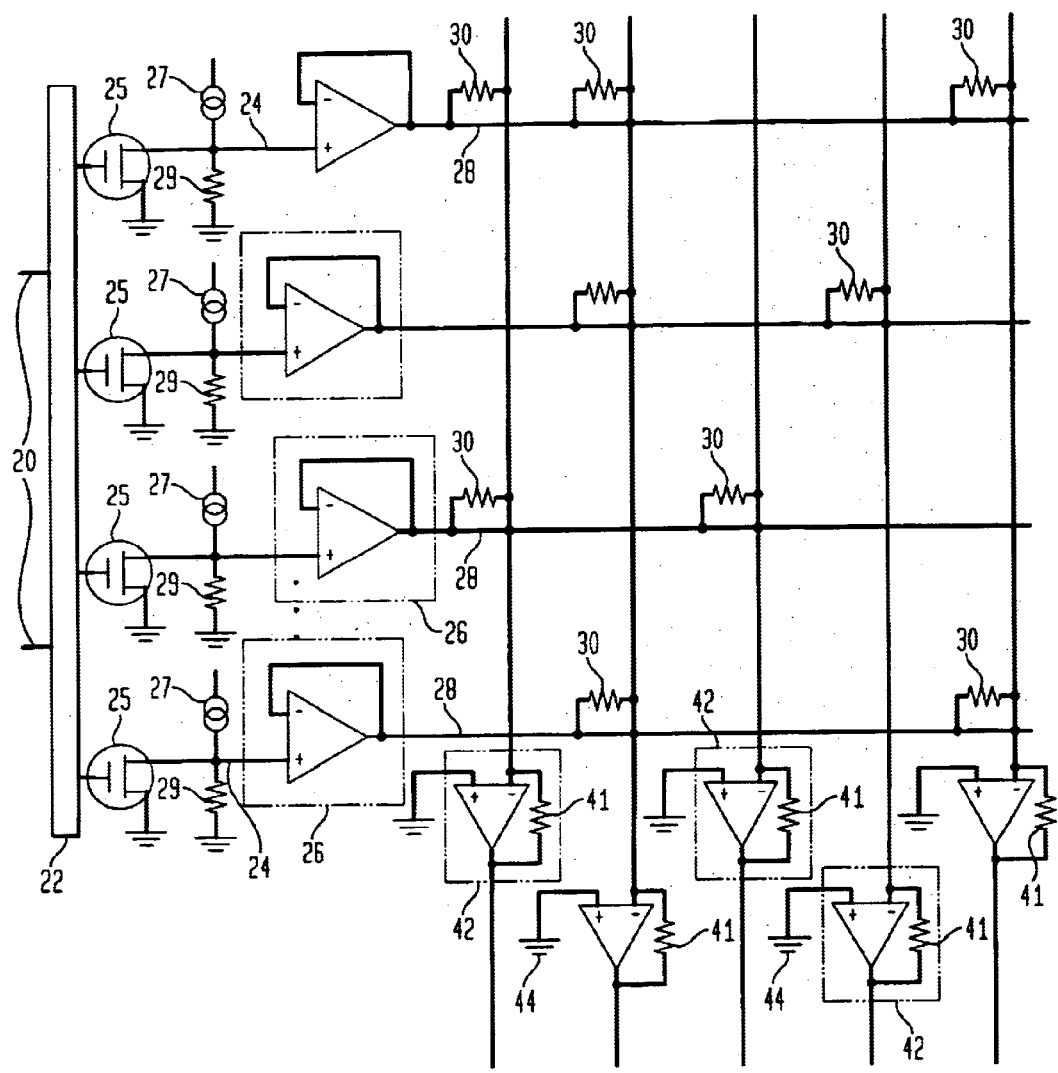
FIG. 3 is a plan view of one embodiment of the invention illustrated in FIG. 2 incorporated into the ROM device illustrated in FIG. 1.

It is to be understood that these drawings are for purposes of illustrating the inventive concepts of the present invention. It will be appreciated that the same reference numerals, possibly supplemented with reference characters where appropriate, have been used throughout the figures to identify corresponding parts.

DETAILED DESCRIPTION

FIGS. 1 through 4 and the accompanying detailed description contained herein are to be used as illustrative examples of exemplary embodiments of the present invention and should not be construed as the only manner of practicing the invention.

Referring now to FIG. 2, there is shown an exemplary embodiment of the invention. In this embodiment of the invention, switch 25 is used to translate a command on an input address line 24 to a voltage on word line 28. In the exemplary embodiment of the invention illustrated, a MOSFET switch is used to translate an address line command to a word line voltage. As would be understood by those skilled in the art, a plurality of different switch types, using different technologies, may be used to translate an address line command to a word line voltage. For example, CMOS, Bi-polar transistor, diodes, mechanical and electro-static switches may be used in accordance with the invention. In this illustrated embodiment, when switch 25 is gated high (i.e., on) the current $1_a$, generated by constant current source 27, flows through the switch to ground. However, when the illustrated switch is gated low (i.e., off) then current, $I_a$, develops a reference voltage, $V_r$, across reference resistor 29 that is applied as input voltage, $V_i$, to driver 26. As illustrated, driver 26 is represented as an unity gain operational amplifier configured as a voltage follower. As is known in the art, the voltage $V_i$ at the high impedance input of the amplifier is present at the low impedance output of the amplifier. Hence, the reference voltage is present at the input side of data resistor 30. In accordance with one embodiment of the invention, reference resistor 29 is formed from a material with substantially similar properties of conductivity as those of data resistor 30. For example, if data resistor 30 is comprised of a metal oxide, reference resistor 29 is also comprised of a metal oxide. In this case, the resistance values of data resistor 30 and reference resistor 29 change at substantially the same rate in response to a change in temperature. Accordingly, with constant current $I_a$ supplied to reference resistor 29, the voltage developed across reference resistor 29 at any temperature is substantially the same as the voltage drop across data resistor 30 caused by current $I_a$ flowing through data resistor 30. thus adjusted at a rate that maintains current $I_a$ substantially constant through data resistor 30 when the associated word line is selected.

FIG. 3 illustrates one embodiment of the present invention incorporated in a resistive device ROM illustrated in FIG. 1. In this embodiment of the invention, a temperature compensation circuit of the type illustrated in FIG. 2 is connected to each input word line 28 through driver amplifier 26. In this illustrated embodiment, inputs 20 provide commands to an n-stage ring counter 22 having a series of outputs connected to address lines 24. Address lines 24 are then connected, in this illustrated embodiment to a series of MOSFET switches 25, one switch for each address line. Coupled to each switch, is a reference resistor 29.

As discussed previously in regard to FIG. 2, reference voltage $V_r$ is developed across reference resistor 29 by supplying a constant current to temperature-dependent reference resistor 29, when the illustrated switch 25 is gated low. When switch 25 is gated high, the reference voltage is nominally at ground level. Reference voltage $V_r$ is then used as input voltage $V_i$ to driver 26. Drivers 26 are typically in a low output state and each driver, when turned on, produces an output voltage $V_o$ that follows the input voltage, $V_i$. In accordance with one embodiment of the invention, $V_i$ is either a nominally zero level when a selected MOSFET switch 25 is gated on or a nominally $V_r$ level when a selected MOSFET switch 25 is gated off.

As discussed in the referenced U.S. Patent, word line 28 is insulated from the bit line 40 except at selected cell sites where a connection is made between a word line and a bit line by data resistor 30. At the memory cells where data resistor 30 is present, current $I_a$ flows from word line 28 to bit line 40. Current $I_a$ is then conveyed sense amplifier 42 by bit line 40.

In this illustrated embodiment of the invention, sense amplifier 42 is a feedback operational amplifier with a gain determined by feedback resistor 41. As would be understood in the art, sense amplifier 42 may be operated either in a linear or non-linear mode. In the shown embodiment, feedback resistor 41 is a fixed value, and is substantially independent of temperature. The output voltage of sense amplifier 42 may then be determined from current $I_a$ and feedback resistor 41. As both the current $I_a$ and resistor 41 are temperature-independent, the output voltage remains substantially constant.

Figure 4:
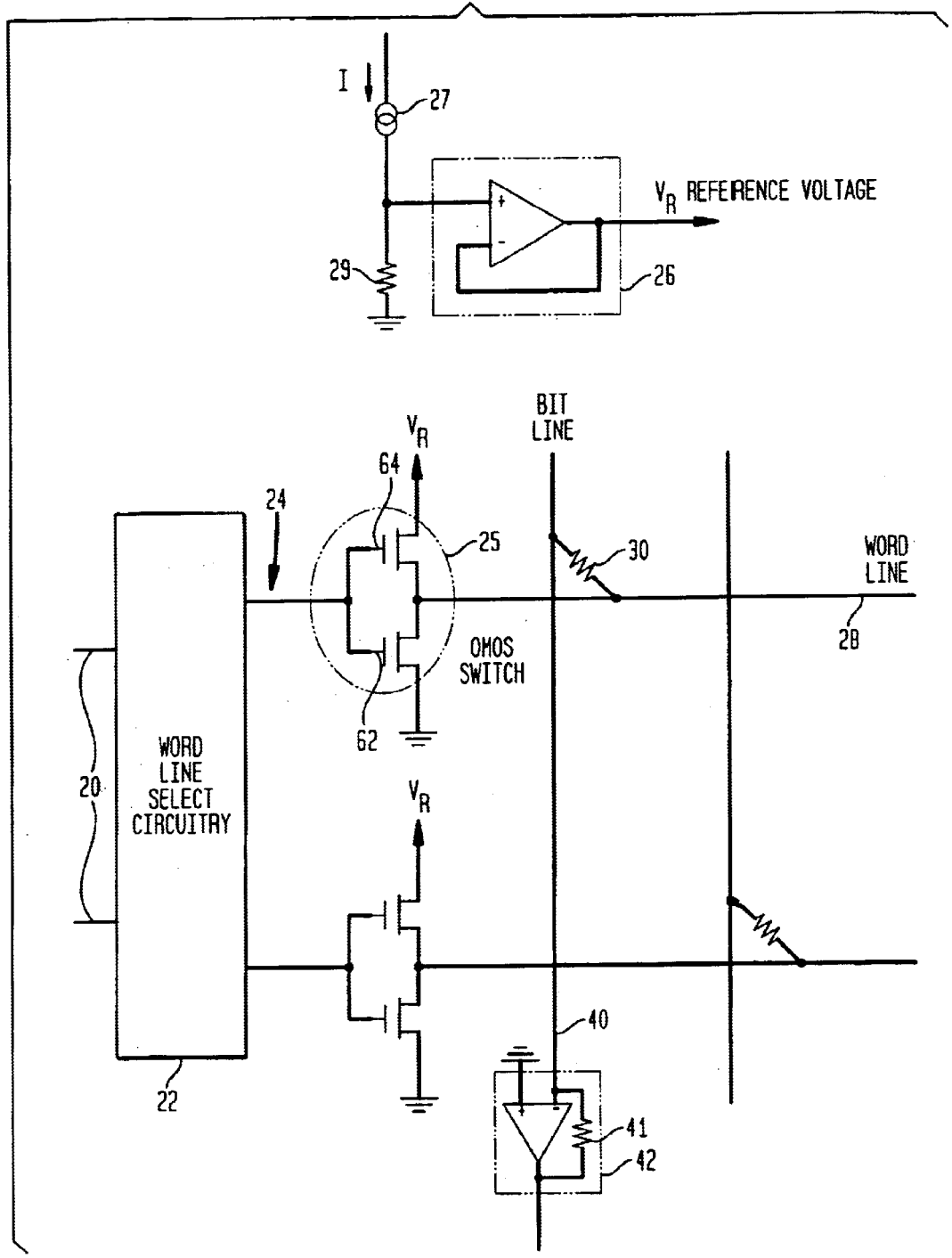
FIG. 4 is a second embodiment of the invention illustrated in FIG. 2 incorporated in the ROM device illustrated in FIG. 1.

FIG. 4 illustrates a second embodiment of the invention as applied to a ROM device illustrated in FIG. 1. In this embodiment of the invention, a single constant current source 27 and reference resistor 29 are used to generate reference voltage $V_r$. Reference voltage $V_r$ is then applied to each word line 28 through, in this illustrated embodiment, CMOS switch 25. As illustrated, CMOS switch 25 is implemented as an inverter composed of two complementary MOSFET switches 62 and 64. In this embodiment, when a selected address line 24 is high, switch 64 is gated off and switch 62 is gated on. Accordingly, the voltage level at the input to drive 26 and, correspondingly, word line 28 is nominally at a ground level. However, when a selected address line 24 is low switch 64 is gated on and MOSFET switch 62 is gated off. In this case, the voltage level at the input to drive 26 and, correspondingly, on word line 28 is nominally reference voltage $V_r$. This embodiment of the invention is advantageous over that illustrated in FIG. 3 as the same reference voltage is selectively applied to each of the plurality of input drivers 26.

In the specific case of a ROM employing polysilicon data resistors, it is further advantageous to operate the data resistor in a non-linear region. Properties of polysilicon are well known in the art. As is known in the art, the current through a polysilicon resistor is determined as:

$$I(v) = \hat{I}_o \sinh\left(\frac{V}{V_o}\right) \text{ where} \quad [1]$$

$$\hat{I}_o = a * \exp\left(\frac{-E_0}{kT}\right); \quad [2]$$

$V_O$ is proportional to the absolute temperature, T;
k is Boltzmann's constant; and
$E_O$ is approximately 0.5 eV, which is approximately half the bandgap of silicon.

From Equation 1 it would be understood by one skilled in the art that when the voltage, V, is greater than $V_o$, then the resistance in the polysilicon material is non-linear. A more detailed presentation of the properties of polysilicon materials may be found in Chapter 5 of "Polycrystalline Silicon for Integrated Circuit Applications," Ted Kamins, Kluwer Academic Publishers, Boston, 1988. Furthermore, it is understood from Equations 1 and 2, that the current, I(v), is exponentially related to the voltage and the inverse of temperature, therefore, large changes in resistive value are compensated by small changes in voltage. In still another embodiment of the invention, the current flowing through data resistor 30 may be proportional to the input current $I_a$.

As would be understood by those skilled in the art, the reference voltage, $V_r$, may be generated by analog or digital means from locally measured temperature. Further still, the reference voltage may be developed externally or internally to the ROM. In a preferred embodiment of the invention, polysilicon reference resistors and an analog method are used to generate the reference voltage.

The examples given herein are presented to enable those skilled in the art to more clearly understand and practice the instant invention. The examples should not be considered as limitations upon the scope of the invention, but as merely being illustrative and representative of the use of the invention. Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claims is reserved.

What is claimed is:

1. In a ROM device using a plurality of data resistors to interconnect a plurality of input word lines with a plurality of output bit lines, a temperature compensation circuit to maintain a current through a selected one of a plurality of data resistors substantially constant comprising:

at least one reference resistor, wherein the conductivity of said reference resistors is responsive to changes in temperature;

a constant current source coupled to said at least one reference resistor, said constant current source developing a voltage across said at least one reference resistor; and at least one switch connected to said at least one reference resistor to selectively couple said voltage to a plurality of input word lines wherein the ROM device uses said plurality of data resistors to interconnect said plurality of input word lines with a plurality of output bit lines.

2. A temperature compensation circuit as recited in claim 1 wherein electrical conductive properties of said reference resistor are selected to be the same as the electrical conductive properties of said data resistors.

3. A temperature compensation circuit as recited in claim 2 wherein said data resistor is selected from a polysilicon material.

4. A temperature compensation circuit as recited in claim 3 wherein said polysilicon material is undoped.

5. A temperature compensation circuit as recited in claim 3 wherein said polysilicon material is doped.

6. A temperature compensation circuit as recited in claim 2 wherein said data resistor is comprised of a metal oxide.

7. A temperature compensation circuit as recited in claim 1 wherein conductive properties of said reference resistors are selected such that a change in electrical conductive properties of said reference resistors matches a change in electrical conductive properties of said data resistors.

8. A temperature compensation circuit as recited in claim 7 wherein said data resistor is selected from a polysilicon material.

9. A temperature compensation circuit as recited in claim 8 wherein said polysilicon material is undoped.

10. A temperature compensation circuit as recited in claim 8 wherein said polysilicon material is doped.

11. A temperature compensation circuit as recited in claim 7 wherein said data resistor is comprised of a metal oxide.

12. A temperature compensation circuit as recited in claim 1 further comprising:

a plurality of sense amplifiers coupled to said output bit lines, each output line having at least one sense amplifier, said sense amplifier receiving said constant current flowing through said data resistors wherein each of said sense amplifier provides a constant output voltage.

13. A temperature compensation circuit as recited in claim 12 wherein said sense amplifier comprises an operational amplifier with a fixed feedback resistor, R, wherein said amplifier output voltage is determined from the value of said constant current and said feedback resistor.

14. A temperature compensation circuit as recited in claim 13 wherein said feedback resistor is temperature independent.

15. A temperature compensation circuit as recited in claim 1 wherein said at least one switch selectively couples said voltage to a selected one of said input word lines when an input to said switch is high.

16. A temperature compensation circuit as recited in claim 1 wherein said at least one switch selectively couples said voltage to a selected one of said input word lines when an input to said switch is low.

17. A temperature compensation circuit as recited in claim 12 wherein said sense amplifier is operated in the non-linear region.

18. A temperature compensation circuit as recited in claim 12 wherein said sense amplifier is operated in the linear region.

19. A method to maintain a current through Read-Only Memory (ROM) substantially constant as temperature changes comprising the steps of:

selecting a reference resistor wherein said ROM employs a plurality of data resistors to provide electrical interconnections between a plurality of input lines and output lines and a change in electrical conductive properties of said reference resistor matches a change in electrical conductive properties of said data resistor;

supplying a reference voltage to said input lines, said reference voltage developed by supplying a constant current to said reference resistor, wherein said reference voltage is responsive to a change in temperature and selectively switching said reference voltage to said word line.

20. The method as recited in claim 19 wherein said data resistor is comprised of undoped polysilicon.

21. The method as recited in claim 19 wherein said data resistor is comprised of doped polysilicon.

22. In a ROM device, a temperature compensation circuit to maintain a current through a selected one of a plurality of data resistors substantially constant comprising:

at least one voltage source producing a voltage that is responsive to changes in temperature; and at least one switch connected to said at least one voltage source to selectively couple said voltage to a plurality of input word lines wherein the ROM device uses said plurality of data resistors to interconnect said plurality of input word lines with a plurality of output bit lines.

23. A temperature compensation circuit as recited in claim 22 further comprising:

a plurality of sense amplifiers coupled to said output bit lines, each output line having at least one sense amplifier, said sense amplifier receiving said constant current flowing through said data resistors wherein each of said sense amplifier provides a constant output voltage.

24. A temperature compensation circuit as recited in claim 23 wherein said sense amplifier comprises an operational amplifier with a fixed feedback resistor, R, wherein said amplifier output voltage is determined from the value of said constant current and said feedback resistor.

25. A temperature compensation circuit as recited in claim 24 wherein said feedback resistor is temperature independent.

26. A temperature compensation circuit as recited in claim 23 wherein said sense amplifier is operated in the non-linear region.

27. A temperature compensation circuit as recited in claim 23 wherein said sense amplifier is operated in the linear region.

28. A temperature compensation circuit as recited in claim 22 wherein said at least one switch selectively couples said voltage to a selected one of said input word lines when an input to said switch is high.

29. A temperature compensation circuit as recited in claim 22 wherein said at least one switch selectively couples said voltage to a selected one of said input word lines when an input to said switch is low.

30. A temperature compensation circuit as recited in claim 22 wherein said temperature responsive voltage changes to compensate for changes in voltage across said data resistor.

31. A method to maintain a current through Read-Only Memory (ROM) substantially constant as temperature changes, comprising the steps of:

supplying a reference voltage that is responsive to changes in temperature to a plurality of input lines, wherein said ROM employs a plurality of data resistors to provide electrical interconnections between said plurality of input lines and a plurality of output lines and said reference voltage changes to maintain said current through said data resistor substantially constant and selectively switching said reference voltage to said word line.

* * * * *